United States Patent
Imran et al.

(10) Patent No.: US 8,808,882 B2
(45) Date of Patent: *Aug. 19, 2014

(54) COATED ARTICLE HAVING BORON DOPED ZINC OXIDE BASED SEED LAYER WITH ENHANCED DURABILITY UNDER FUNCTIONAL LAYER AND METHOD OF MAKING THE SAME

(75) Inventors: Muhammad Imran, Brownstown, MI (US); Richard Blacker, Farmington Hills, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 867 days.

This patent is subject to a terminal disclaimer.

(21) Appl. No.: 12/923,391

(22) Filed: Sep. 17, 2010

(65) Prior Publication Data

US 2012/0070672 A1  Mar. 22, 2012

(51) Int. Cl.
  B32B 15/04   (2006.01)
  B32B 17/06   (2006.01)

(52) U.S. Cl.
  USPC ........... 428/701; 428/432; 428/433; 428/434; 428/688; 428/689; 428/699; 428/702

(58) Field of Classification Search
  CPC ........ C03C 17/00; C03C 17/06; C03C 17/22; C03C 17/23; C03C 17/34; C03C 17/3411; C03C 17/36; C03C 17/3602; C03C 17/3607; C03C 17/3615; C03C 17/3618; C03C 17/3644
  USPC ......... 428/432, 701, 702, 433, 434, 688, 689, 428/699
  See application file for complete search history.

(56) References Cited

U.S. PATENT DOCUMENTS

| 4,336,120 A | 6/1982 | Sakakura et al. |
| 5,470,618 A | 11/1995 | Ohara et al. |
| 5,487,918 A | 1/1996 | Akhtar |
| 5,532,062 A | 7/1996 | Miyazaki et al. |
| 6,458,673 B1 | 10/2002 | Cheung |

(Continued)

FOREIGN PATENT DOCUMENTS

| JP | 10-297962 | 11/1998 |
| WO | WO 2009/103929 | 8/2009 |

(Continued)

OTHER PUBLICATIONS

International Search Report mailed Sep. 6, 2011.

(Continued)

Primary Examiner — David Sample
Assistant Examiner — Lauren Colgan
(74) Attorney, Agent, or Firm — Nixon & Vanderhye P.C.

(57) ABSTRACT

A coated article is provided with at least one functional layer, such as an infrared (IR) reflecting layer(s) of or including silver and/or gold. A dielectric and substantially transparent seed layer is provided under and directly contacting the functional layer. In certain example embodiments, the seed layer includes an oxide of zinc and boron for increasing the hardness of the layer and thus improving durability of the overall coating. The seed layer may further include aluminum and/or gallium, for enhancing the electrical properties and/or reducing the stress in the resulting coating. The seed layer may be deposited by a substantially metallic target in the presence of oxygen in certain examples.

14 Claims, 7 Drawing Sheets

(56) References Cited

U.S. PATENT DOCUMENTS

| | | | |
|---|---|---|---|
| 6,541,133 B1 * | 4/2003 | Schicht et al. | 428/697 |
| 6,558,800 B1 | 5/2003 | Stachowiak | |
| 6,576,349 B2 | 6/2003 | Lingle et al. | |
| 6,783,876 B2 * | 8/2004 | Schicht et al. | 428/697 |
| 6,797,389 B1 * | 9/2004 | Depauw | 428/432 |
| 7,153,578 B2 | 12/2006 | Chonlamaitri et al. | |
| 7,198,850 B2 * | 4/2007 | DePauw | 428/432 |
| 7,217,460 B2 | 5/2007 | Nunez-Regueiro et al. | |
| 7,235,160 B2 | 6/2007 | Delahoy et al. | |
| 7,390,572 B2 | 6/2008 | Butz et al. | |
| 7,396,580 B2 | 7/2008 | Kawashima et al. | |
| 7,455,910 B2 | 11/2008 | Stachowiak | |
| 7,534,500 B2 | 5/2009 | Kobayashi et al. | |
| 7,537,677 B2 | 5/2009 | Lu et al. | |
| 7,597,962 B2 | 10/2009 | Butz et al. | |
| 7,622,161 B2 | 11/2009 | Veerasamy | |
| 7,629,742 B2 | 12/2009 | Anderson et al. | |
| 7,641,978 B2 | 1/2010 | Veerasamy | |
| 7,645,487 B2 | 1/2010 | Petrmichl et al. | |
| 7,648,769 B2 | 1/2010 | Blacker et al. | |
| 7,655,313 B2 | 2/2010 | Blacker et al. | |
| 7,678,446 B2 | 3/2010 | Yasuda et al. | |
| 7,695,785 B2 | 4/2010 | Lu et al. | |
| 7,718,266 B2 | 5/2010 | Kriltz et al. | |
| 7,718,267 B2 | 5/2010 | Veerasamy | |
| 8,119,194 B2 * | 2/2012 | Koekert et al. | 427/162 |
| 2003/0143435 A1 * | 7/2003 | Schicht et al. | 428/697 |
| 2004/0219343 A1 * | 11/2004 | DePauw | 428/212 |
| 2006/0121290 A1 * | 6/2006 | Chonlamaitri et al. | 428/428 |
| 2006/0159932 A1 | 7/2006 | Lu et al. | |
| 2006/0188730 A1 | 8/2006 | Varanasi et al. | |
| 2008/0057225 A1 | 3/2008 | Stricker et al. | |
| 2010/0072884 A1 | 3/2010 | Tchakarov et al. | |

FOREIGN PATENT DOCUMENTS

| | | |
|---|---|---|
| WO | WO 2009/115596 | 9/2009 |
| WO | WO 2009/115599 | 9/2009 |
| WO | WO 2009/133076 | 11/2009 |

OTHER PUBLICATIONS

"Zinc Oxide and Related Compounds: Order Within the Disorder", Martins et al., Proc. of SPIE vol. 7217; Dec. 31, 2009, pp. 1-13.

"Magnetron Sputtering of Transparent Conductive Zinc Oxide: Relation Between the Sputtering Parameters and the Electronic Properties", Ellmer, J. Phys. D: Appl Phys. 33 (2000) R17-R-32.

"Durability of Doped Zinc Oxide/Silver/Doped Zinc Oxide Low Emissivity Coatings in Humid Environment", Ando et al., Thin Solid Films 516 (2008) 4574-4577.

U.S. Appl. No. 12/923,390, filed Sep. 17, 2010, Krasnov et al.

* cited by examiner

COATED ARTICLE HAVING BORON DOPED ZINC OXIDE BASED SEED LAYER WITH ENHANCED DURABILITY UNDER FUNCTIONAL LAYER AND METHOD OF MAKING THE SAME

BACKGROUND AND SUMMARY OF THE INVENTION

Low-emissivity coatings are known in the art. Low-E coatings typically comprise at least one functional layer such as an infrared (IR) reflecting layer. The IR reflecting layer(s), or functional layer(s), may be of or based on silver or gold in typical instances. Low-E coatings are typically used in window applications such as in IG (insulating glass) window units, monolithic window, architectural windows, and/or in vehicle windows.

The thin IR reflecting layers (e.g., based on silver) are often used to reflect IR radiation. These silver-based layers are susceptible to damage, and generally require protective layers on both sides to protect them. The layer directly under and contacting the silver based IR reflecting layer in some instances is of zinc oxide, and may be referred to as a seed layer. This zinc oxide-based layer may be doped with aluminum.

However the ZnO-based layer may be relatively soft, which results in a lack of overall chemical and mechanical durability of the layer and the coating. Also, an un-doped ZnO-based layer, or a doped ZnO:Al-based layer may be stressed in a low E-stack. This can result in the formation of weak spots, and contributes to overall poor durability, including corrosion of the coating. The IR reflecting layer can become damaged, chemically and/or mechanically, due to such stress in the ZnO:Al layer. The stress of the coating can become particularly problematic during or due to thermal tempering, when the glass substrate with the coating thereon is heated to a high temperature (e.g., at least 580 degrees C.) and then rapidly cooled down.

There is therefore a need in the art for a coated article having a layer, to be located proximate or near (e.g., under) an IR reflecting layer and/or a silver based layer, that enables a coated article to realize improved durability and/or optical characteristics.

In certain example embodiments of this invention, there is provided a coated article including a coating supported by a glass substrate, the coating comprising at least the following layers moving away from the glass substrate: a dielectric layer comprising zinc oxide doped with boron and at least one of gallium and/or aluminum; an infrared (IR) reflecting layer comprising silver and/or gold located on the substrate over and directly contacting the layer comprising zinc oxide doped with boron, a dielectric layer on the substrate over at least the IR reflecting layer; and wherein the layer comprising zinc oxide doped with boron includes from about 0.01 to 8% boron. The layer comprising zinc and boron may be called a "seed" layer because it is directly under and contacting an IR reflecting layer and/or a layer comprising silver.

In other example embodiments of this invention, there is provided a coated article including a coating supported by a substrate, the coating comprising at least the following layers, moving away from the substrate: a substantially transparent seed layer comprising a first material and a second material, wherein the dielectric seed layer has a hardness of at least about 9 GPa; a layer comprising silver located on the substrate over and directly contacting the seed layer, at least one dielectric layer over at least the layer comprising silver; wherein the first material is a metal, and the second material is used to dope an oxide of the first material in the seed layer. The coated article may or may not be heat treated (e.g., thermally tempered). The second material may be boron in certain example embodiments, although other material such as gallium and/or aluminum may instead be used.

In another example embodiment of this invention, there is provided a method for making a coated article, the method comprising the steps of sputter depositing from a substantially metallic target a dielectric layer comprising zinc oxide and boron on a glass substrate over at least one dielectric layer, wherein the substantially metallic target comprises at least about 85% zinc and about 0.01 to 8% boron; and sputter-depositing an IR reflecting layer comprising silver and/or gold on the glass substrate over and directly contacting the layer comprising zinc oxide doped with boron.

In yet another example embodiment of this invention, there is provided a sputtering target for sputter depositing a dielectric layer comprising boron-doped zinc oxide, wherein the target is substantially metallic, and comprises at least about 85% zinc and from about 0.02 to 5% boron.

In still other example embodiments of this invention, there is provided a method for making a coated article, the method comprising the steps of sputter-depositing a dielectric layer comprising zinc oxide doped with boron on a glass substrate over at least one dielectric layer, wherein the layer comprising zinc oxide doped with boron is deposited in a sputtering atmosphere comprising at least about 50% oxygen; and sputter-depositing an IR reflecting layer comprising silver and/or gold on the glass substrate over and directly contacting the layer comprising zinc oxide doped with boron.

DETAILED DESCRIPTION OF THE INVENTION

Figure 1:
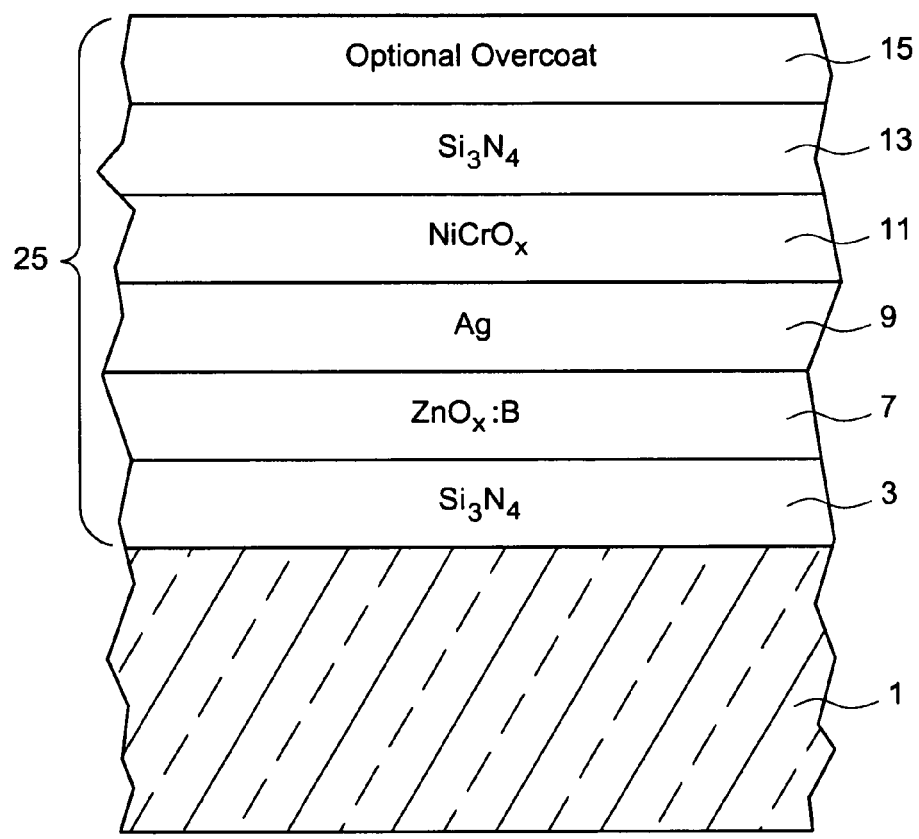
FIG. 1 is a cross-sectional view of a coated article according to a first example embodiment of this invention.

Referring now more particularly to the accompanying drawings in which like reference numerals indicate like parts or layers throughout the several views.

Coated articles herein may be used in coated article applications such as low-E coatings for monolithic windows, IG window units, vehicle windows, and/or any other suitable application that includes single or multiple substrates such as glass substrates, such as a filter for an electronic device.

Certain embodiments of this invention relate to a coated article which includes at least one substrate (e.g., glass substrate) supporting a multilayer coating. The coating typically has at least one functional layer such as an infrared (IR) reflecting layer which reflects and/or blocks at least some IR radiation. The IR reflecting layer(s) may be of or include a material such as silver, gold, or the like in different embodiments of this invention. Often, an IR reflecting layer of a low-E coating is sandwiched between at least first and second dielectric layers of the coating. The lower layer, often a dielectric layer, directly under and contacting the functional layer (e.g., layer comprising silver) may be referred to as a seed layer. The IR reflecting layer and the seed layer are typically substantially transparent to visible light (e.g., at least about 30% transparent, more preferably at least about 40% transparent, even more preferably at least about 50% transparent, and most preferably at least about 60% or 70% transparent).

In certain example embodiments of this invention, it has surprisingly been found that the provision of a layer consisting essentially of, or comprising, a boron-doped oxide of zinc as a seed layer(s) in such a coating unexpectedly improves physical and chemical durability of the coating in a manner which does not significantly degrade other electrical properties of a coated article, or its optical properties such as visible transmission and/or color. One or more such boron-doped zinc oxide based seed layers may be provided in a given coating in different embodiments of this invention. In any embodiment discussed herein, the boron-doped zinc oxide based seed layer may also include other dopant materials, such as aluminum and/or gallium. Moreover, boron-doped zinc oxide layer(s) may be provided in any type of solar control or low-E (low-emissivity, or low emittance) coating in different embodiments of this invention, and the specific low-E coatings described herein are for purposes of example only unless recited in the claim(s). In the figures, example layers of or including boron-doped zinc oxide are referred to by reference numerals 7 and 7'. A typical silver-based coating includes at least one thin silver-based functional layer protected by at least one transparent layer on each side. The silver based layer (9, 9') is substantially metallic or metallic in certain example embodiments. In certain instances, the silver-based layer (9, 9') is deposited on a substantially transparent dielectric seed layer (7, 7') which can comprise or consist essentially of an oxide of zinc (Zn) and boron (B), as well as other doping materials such as aluminum (Al) and/or gallium (Ga). In certain example embodiments, the seed layer may comprise an oxide of zinc, with a certain crystal orientation in certain example instances, to ensure that the layer has optimal electrical and optical performance.

Zinc oxide or zinc oxide doped with aluminum for reactive deposition is traditionally used as the material of choice for a seed layer directly under a silver-based IR reflecting layer in sputtered coatings (e.g., large-area magnetron DC sputtering). Aluminum is provided as a dopant in zinc oxide at least in part because there is a requirement for a certain electrical conductivity of the sputtering target during the deposition target. It has surprisingly been found that boron (B) and/or gallium (Ga) maybe instead or also be used to dope the zinc oxide based layer for reactive deposition, resulting in improved durability.

The aluminum-doped zinc or zinc oxide layer(s) may experience stress in the coating stack, which results in the formation of weak spots, and contributes to an overall lack of durability of the coating, and which can even include corrosion of the coating. The stress of the coating becomes especially evident during heat treatment such as thermal tempering, when the glass substrate with the coating thereon is heated to high temperatures (e.g., at least about 580 degrees C.) and rapidly cooled down.

It has been found that a reason for stress in doped zinc or zinc oxide layer is the mismatch between the ionic radii of the zinc particles and that of dopant particles. The ionic radius of the "host," zinc, is approximately 74 picometers (pm), whereas the ionic radius of the dopant(s) may, in certain embodiments, be smaller. As a result of this size mismatch, the substitution of zinc with the dopant can cause the host lattice (e.g., the zinc oxide lattice) to shrink, which in turn may cause stress in the zinc oxide-based layer, the silver based layer, and in the entire coating stack.

ZnO, ZnO:Al, and ZnO:Ga based layers (i.e., zinc oxide which may be doped with Ga and/or Al) are thought to be comparatively soft materials. ZnO is reported to have a hardness of about 5-7 GPa. However, it has surprisingly been found that doping ZnO, ZnO:Al, and/or ZnO:Ga with boron (B) can increase the hardness up to about 9-12 GPa. This hardness is closer to the hardness of Si (~12 GPa) and TaN (~15 GPa), which are more chemically durable than ZnO. Therefore, in certain example embodiments, doping ZnO, ZnO:Al, and/or ZnO:Ga with boron will advantageously result in a harder layer with a greater mechanical and/or chemical durability according to certain example embodiments of this invention.

It has surprisingly been found that boron-doped ZnO, ZnO:Al, and/or ZnO:Ga may be used in certain example embodiments in order to form a more mechanically and/or chemically durable coating. A layer comprising boron doped ZnO, ZnO:Al, and/or ZnO:Ga (e.g., 7, 7') may be provided directly under and contacting a functional layer comprising silver or gold (e.g., 9, 9') in certain example embodiments. In certain embodiments, this boron-doped ZnO, ZnO:Al, and/or ZnO:Ga layer (7, 7') may be used as a dielectric and substantially transparent seed layer in a coated article which may be used in a window unit as a low-E coating or in an electronic device, for example. This boron-doped zinc oxide-based layer (e.g., 7, 7') may be dielectric in certain example embodiments.

In certain example embodiments, a substantially metallic zinc target may further comprise and/or include boron. In certain example embodiments, the substantially metallic zinc target may comprise at least about 85% zinc by weight, more preferably at least about 90% zinc by weight, and most preferably at least about 92% by weight. The target may further include at least about 0.01 to 8% boron by weight, more preferably from about 0.02 to 5% boron by weight, more preferably from about 0.02 to 3% boron by weight, and most preferably from about 0.5 to 3% boron by weight. Other materials may also be included in the target, for example and without limitation, gallium and/or aluminum. It is noted that the amounts of boron and/or aluminum and/or gallium in the target sputtering material tend to also end up in the resulting zinc oxide inclusive layer on the substrate in like amounts.

The boron-inclusive zinc target may be used to sputter deposit a seed layer comprising, or consisting essentially of, boron-doped zinc oxide. This boron-doped zinc oxide-based layer may further include other materials in certain example embodiments. The zinc and boron may be sputter deposited in the presence of oxygen, for reactive deposition, in certain instances. In certain example embodiments, at least about 50%, more preferably at least about 60%, of the total gas in the sputtering chamber is oxygen (molar percent). Put another way, in certain example embodiments, a layer of or including boron-doped ZnO, ZnO:Al, and/or ZnO:Ga is deposited in a sputtering atmosphere comprising at least about 50% oxygen, and more preferably at least about 60% oxygen.

In certain example embodiments of this invention, a layer of or including boron-doped ZnO, ZnO:Al, and/or ZnO:Ga may be tuned in a manner so as to increase the hardness and/or durability of the layer. Moreover, it is expected that the addition of boron to a layer including ZnO, ZnO:Al, and/or ZnO:Ga will not adversely affect the stress in the layer. It has been found boron-doped ZnO, ZnO:Al, and/or ZnO:Ga has an improved mechanical durability due to enhanced hardness compared to if the B is not present, so as to increase the overall durability without significantly changing the visible appearance of the coated article or certain performance data.

Boron-doped ZnO, ZnO:Al, and/or ZnO:Ga in certain example embodiments will lead to improved crystallization toward Wurtzite crystal structure of the bulk ZnO plane, and that the grains are more uniform than those of non-B-doped ZnO, ZnO:Al, and/or ZnO:Ga based films. In certain example embodiments, the resistivity of ZnO is higher than that of boron-doped ZnO based films, because of the absorption of oxygen in the ZnO grain boundaries. The resistivity values for non-B-doped and boron-doped ZnO based layers are on the order of $10^{-2}$ ohm cm and $10^{-4}$ ohm cm, respectively. Thus, in certain example embodiments, the addition of boron will improve the microstructure and electrical properties of the films in addition to improving the hardness and mechanical durability. This can advantageously result in enhanced properties of Ag-inclusive layers and/or films of the low-E coatings.

Thus, in certain example embodiments, a boron-doped ZnO, ZnO:Al, and/or ZnO:Ga based layer is advantageously used as the seed layer for a single or multiple layer silver-based low-E stack, directly under and contacting an IR reflecting layer of or including silver.

In certain example embodiments, e.g., for layers 7, 7', the zinc oxide may be doped only with boron, with boron and aluminum, with boron and gallium, and/or with a combination of boron, gallium, and aluminum. The concentration of boron in a ZnO, ZnO:Al, and/or ZnO:Ga based layer may be from about 0.01 to 8% by weight, more preferably from about 0.02 to 5% by weight, more preferably from about 0.02 to 3% by weight, and most preferably from about 0.5 to 3% by weight. In certain example embodiments, in addition to being doped with boron, the boron-doped zinc oxide-based layer may further be doped with from about 0.25 to 10% by weight aluminum, more preferably from about 0.5 to 5% aluminum, and most preferably from about 1-5% by weight aluminum. In certain example embodiments, in addition to being doped with boron, the boron-doped zinc oxide-based layer may further be doped with from about 0.25 to 10% by weight gallium (Ga), more preferably from about 0.5 to 5% gallium, and most preferably from about 1-5% by weight gallium. In still other example embodiments, in addition to being doped with boron, the boron-doped zinc oxide based layer may be further doped with a combination of both Al and Ga in the amounts described above. The boron-doped ZnO, ZnO:Al, and/or ZnO:Ga based layer (e.g., 7, 7') may be sputter deposited, in certain example embodiments. Doping a zinc oxide-based layer doped with boron and optionally at least some gallium may be particularly advantageous in certain example embodiments, as this will reduce the stress of the layer in addition to increasing its hardness and mechanical durability. However, doping ZnO or ZnO:Al with boron will produce desirable results in certain example embodiments as well.

In certain example embodiments of this invention, doping ZnO, ZnO:Al and/or ZnO:Ga with boron leads to an improved crystallization structure and a greater hardness, with improved durability. While boron is the preferred material for doping zinc oxide, this invention is not so limited, and other dopants producing a similar hardness may be used.

In certain example embodiments of this invention, boron-doped ZnO, ZnO:Al and/or ZnO:Ga may be used to replace a layer of a ZnO, ZnO:Al and/or ZnO:Ga seed layer, or any other layer provided directly underneath and contacting a silver and/or gold based functional layer. The use of a layer of boron doped ZnO, ZnO:Al and/or ZnO:Ga in this respect has been surprisingly found to improve chemical, electrical, and mechanical durability of the coated article.

In certain example embodiments, a zinc based sputtering target is provided in order to form the boron-doped ZnO, ZnO:Al and/or ZnO:Ga based layer (e.g., via reactive sputtering) 7, 7'. The target used may be either metal or ceramic. The sputter chamber may contain oxygen and/or argon gas during the sputtering process, in order to sputter a seed layer comprising the oxide of zinc doped with at least boron. The zinc based target may contain aluminum and/or gallium to facilitate reactive sputtering, in certain example embodiments. The zinc based target may also contain boron in amounts similar to the amounts of boron that end up on the B-doped zinc oxide based layer 7, 7'. In certain example embodiments, the zinc target for sputter-depositing layer 7, 7' may contain from about 0.02 to 5% boron by weight, more preferably from about 0.02 to 3% boron by weight, and most preferably from about 0.5 to 3% boron by weight. The zinc target, in certain example embodiments, may optionally also comprise from about 0.25 to 10% gallium (by weight), more preferably from about 0.25 to 5% gallium (by weight), and most preferably from about 1-5% or 1-4% gallium (by weight).

The substrate 1 (e.g., glass substrate) upon which the coating 25 including the layer(s) comprising boron-doped ZnO, ZnO:Al and/or ZnO:Ga is deposited may, during deposition, be kept at room temperature or may be heated in certain example embodiments. The substrate 1 may preferably be at a temperature less than about 300 degrees C., more preferably less than 200 degrees C., and most preferably, less than 150 degrees C., and often at approximately room temperature.

A coated article as described herein (e.g., see FIGS. 1-5) may or may not be heat treated (e.g., thermally tempered) in certain example embodiments. Such heat treatment typically requires use of temperature(s) of at least about 580 degrees C., more preferably of at least about 600 degrees C. and still more preferably of at least 620 degrees C. The terms "heat treatment" and "heat treating" as used herein mean heating the article to a temperature sufficient to achieve thermal tempering and/or heat strengthening of the glass inclusive article. This definition includes, for example, heating a coated article in an oven or furnace at a temperature of at least about 550 degrees C., more preferably at least about 580 degrees C., more preferably at least about 600 degrees C., more preferably at least about 620 degrees C., for a sufficient period to allow tempering and/or heat strengthening. This may be for at least about two minutes, or up to about 10 minutes, in certain example embodiments.

Boron-doped ZnO, ZnO:Al and/or ZnO:Ga layers according to different embodiments of this invention realize good mechanical and chemical durability. Thus, coated articles having such layers are advantageous in that they have a greater hardness and mechanical durability than zinc oxide-based layers not doped with boron. Moreover, when the zinc oxide is also doped with aluminum, it will retain good electrical properties, and when the zinc oxide is also doped with gallium, or gallium and aluminum, it retains good electrical properties, and additionally will make a less stressed, more durable layer stack and coated article.

Figure 6:
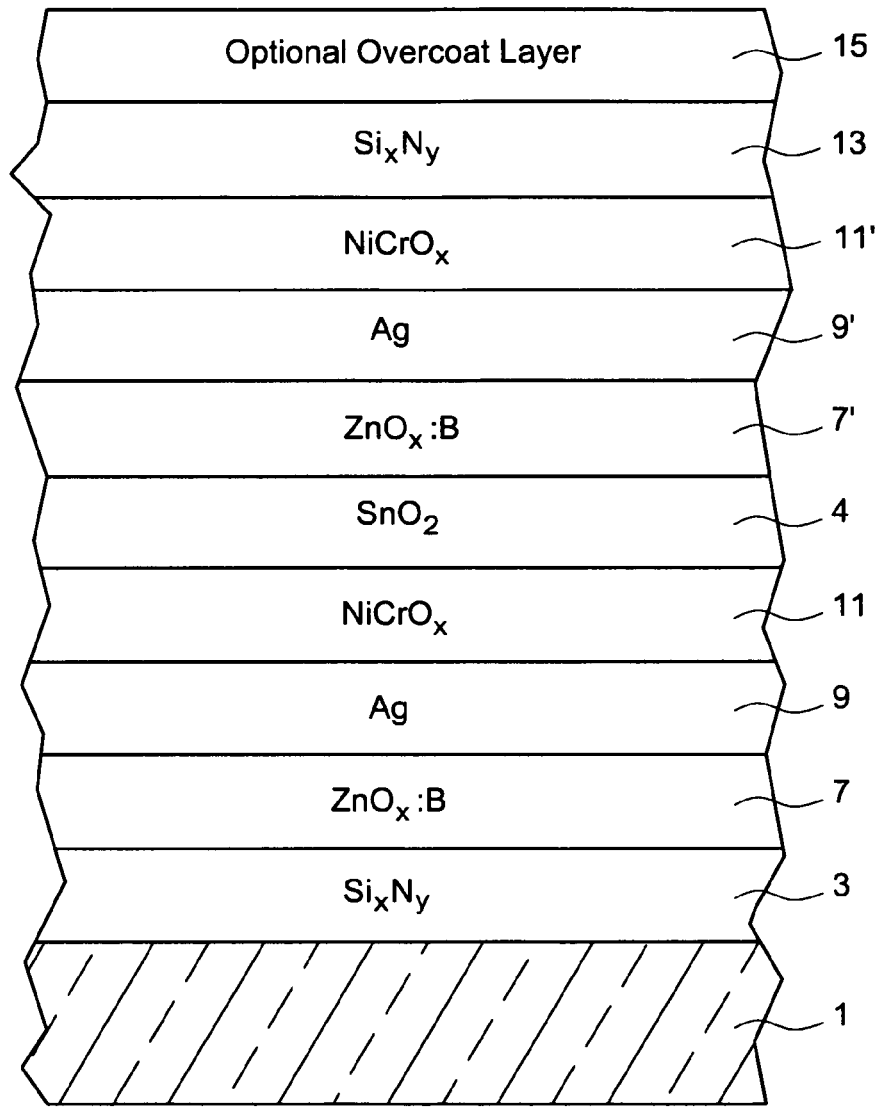
FIG. 6 is a cross-sectional view of a coated article according to a sixth example embodiment of this invention.
Figure 7:
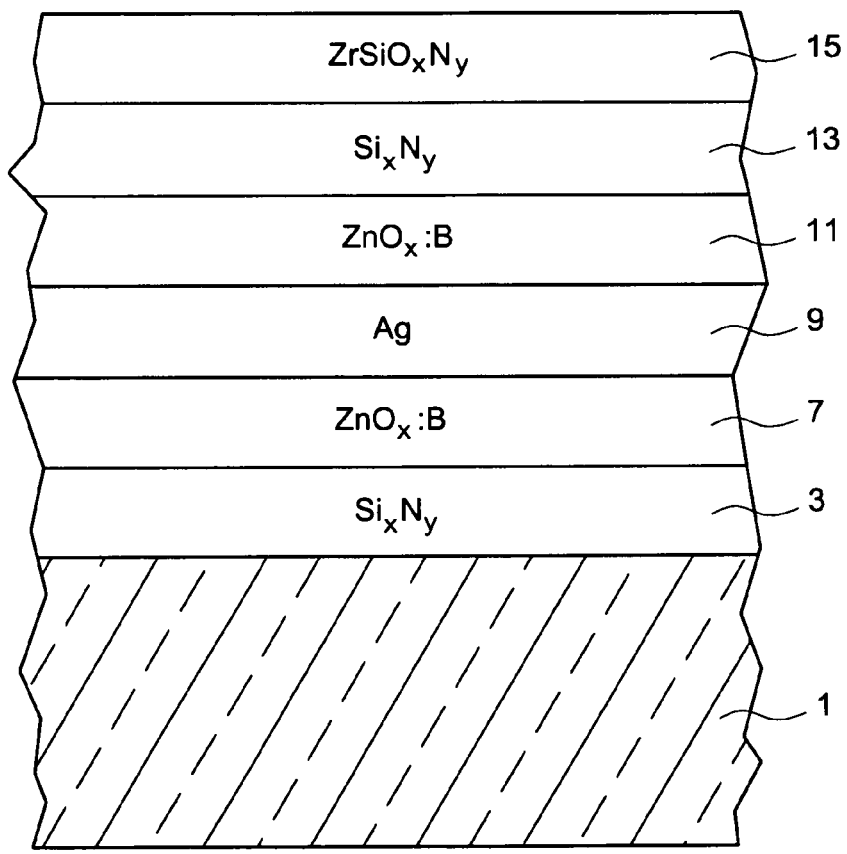
FIG. 7 is a cross-sectional view of a coated article according to a seventh example embodiment of this invention.

In addition to being used as a seed layer, boron-doped ZnO, ZnO:Al and/or ZnO:Ga layers according to different example embodiments of this invention may be used in various locations, such as over and contacting an IR reflecting layer (e.g., FIG. 7). The example coated articles described below and shown in FIGS. 1-7 are provided for purposes of example only.

FIG. 1 is a cross sectional view of a coated article according to an example embodiment of this invention. The coated article includes glass substrate 1 (e.g., clear, green, bronze, or blue-green glass substrate from about 1.0 to 10.0 mm thick, more preferably from about 1.0 mm to 6.0 mm thick), and a multi-layer coating (or layer system) provided on the substrate either directly or indirectly. As shown in FIG. 1, the coating 25 comprises dielectric layer 3, boron-doped zinc oxide inclusive seed layer 7, IR reflecting layer 9 of or including silver, gold, or the like, upper contact layer 11 of or including an oxide of Ni and/or Cr (e.g., $NiCrO_x$) or the like, dielectric layer 13, and dielectric layer 15 of or including a material such as silicon nitride, zirconium oxide, and/or silicon oxynitride which may in certain example instances be a protective overcoat. Other layers and/or materials may also be provided in certain example embodiments of this invention, and it is also possible that certain layers may be removed or split in certain example instances. Optionally, in the FIG. 1 embodiment, a layer (not shown) of or including boron-doped ZnO, ZnO:Al, and/or ZnO:Ga (e.g., similar to layer 7 described herein) may be provided between layers 11 and 13 in certain example embodiments.

Still referring to the FIG. 1 embodiment, for purposes of example only, one or both of layers 3, 13 may be of or include silicon nitride in certain example embodiments. In certain embodiments, layer(s) 3 and/or 13 may comprise silicon oxynitride and/or zirconium silicon oxynitride, or other materials that are preferably dielectric (e.g., layer 3 can be of or including an oxide of titanium). In one example embodiment, both layers 3 and 13 are of or include silicon nitride. In another example embodiment, both layers 3 and 13 are of or include zirconium silicon oxynitride. In yet another example embodiment of this invention, layer 3 is of or includes zirconium silicon oxynitride and layer 13 is of or includes tin oxide or silicon nitride. In still another example embodiment of this invention, layer 13 is of or includes zirconium silicon oxynitride and layer 3 is of or includes titanium oxide (e.g., $TiO_2$) or silicon nitride. These example compositions of layers 3 and 13 are not limiting, and are for example purposes.

Lower dielectric and substantially transparent seed layer 7 in certain embodiments of this invention is of or includes zinc oxide (e.g., ZnO) doped with boron (B), optionally being doped as well with Al and/or Ga; e.g., to form one or more of $ZnBO_x$ or ZnO:B, $ZnBGaO_x$ or ZnO:Ga:B, $ZnBAlO_x$ or ZnO:Al:B. For example, in certain example embodiments of this invention, zinc oxide based layer 7 (and/or 7') may be doped with from about 0.01 to 8% boron by weight, more preferably from about 0.02 to 5% boron by weight, more preferably from about 0.02 to 3% boron by weight, and most preferably from about 0.5 to 3% boron by weight. Optionally, in certain example embodiments, in addition to being doped with boron, the boron-doped zinc oxide-based layer 7 (and/or 7') may further be doped with from about 0.25 to 10% by weight aluminum, more preferably from about 0.5 to 5% aluminum, and most preferably from about 1-5% by weight aluminum; and/or with from about 0.25 to 10% by weight gallium (Ga), more preferably from about 0.5 to 5% gallium, and most preferably from about 1-5% by weight gallium. The use of boron-doped zinc oxide 7 under and directly contacting the silver based functional layer (e.g., IR reflecting layer) 9 allows for an excellent quality of silver to be achieved (e.g., realizing low sheet resistance and low emissivity, and better durability due to the increased hardness of the boron-doped zinc oxide layer). The zinc oxide of layer 7 may contain other materials as well in certain example embodiments. In certain example embodiments, a boron-doped zinc oxide inclusive layer may also be used as an upper contact layer (layer 11). When a boron-doped zinc oxide inclusive is used as an upper contact layer 11, the descriptions herein relating to layer 7 may also apply to the boron-doped zinc oxide based layer 11.

Functional layer 9 is typically an infrared (IR) reflecting layer that is preferably substantially or entirely metallic and/or conductive, and may comprise or consist essentially of silver (Ag), gold, or any other suitable IR reflecting material. IR reflecting layer 9 helps allow the coating to have low-E and/or good solar control characteristics such as low emittance, low sheet resistance, and so forth. The IR reflecting layer 9 may be slightly oxidized in certain embodiments of this invention, and optionally may be doped.

The upper contact layer 11 may be of or include an oxide of Ni and/or Cr. In certain example embodiments, upper contact layer 11 may be of or include nickel (Ni) oxide, chromium/chrome (Cr) oxide, or a nickel alloy oxide such as nickel chrome oxide ($NiCrO_x$), or other suitable material(s) such as Ti or an oxide of Ti. Layer 11 may be fully oxidized in certain embodiments of this invention (i.e., fully stoichiometric), or alternatively may only be partially oxidized. In certain instances, the $NiCrO_x$ layer 11 may be at least about 50% oxidized. Contact layer 11 (e.g., of or including an oxide of Ni and/or Cr) may or may not be oxidation graded in different embodiments of this invention. Oxidation grading means that the degree of oxidation in the layer changes throughout the thickness of the layer so that for example a contact layer may be graded so as to be less oxidized at the contact interface with the immediately adjacent IR reflecting layer than at a portion of the contact layer(s) further or more/most distant from the immediately adjacent IR reflecting layer. Descriptions of various types of oxidation graded contact layers are set forth in U.S. Pat. No. 6,576,349, the disclosure of which is hereby incorporated herein by reference. Contact layer 11 (e.g., of or including an oxide of Ni and/or Cr) may or may not be continuous in different embodiments of this invention across the entire IR reflecting layer 9.

Dielectric layer 15, which may be an overcoat in certain example instances, may be of or include silicon nitride (e.g., $Si_3N_4$) or any other suitable material in certain example embodiments of this invention such as silicon oxynitride and/or zirconium oxide. Optionally, other layers may be provided above layer 15. Layer 15 is provided for durability purposes in certain example embodiments, and to protect the underlying layers. In certain example embodiments, layer 15 may have an index of refraction (n) of from about 1.9 to 2.2, more preferably from about 1.95 to 2.05.

Other layer(s) below, within, or above the illustrated coating 25 may also be provided. Thus, while the layer system or coating is "on" or "supported by" substrate 1 (directly or indirectly), other layer(s) may be provided therebetween. Thus, for example, the coating 25 of FIG. 1 and the layers thereof may be considered "on" and "supported by" the substrate 1 even if other layer(s) are provided between layer 3 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention.

While various thicknesses may be used in different embodiments of this invention, example thicknesses and materials for the respective layers on the glass substrate 1 in the FIG. 1 embodiment are as follows, from the glass substrate outwardly.

TABLE 1

(Example Materials/Thicknesses; FIG. 1 Embodiment)

| Layer | Range (Å) | More Preferred (Å) | Example (Å) |
|---|---|---|---|
| TiO$_x$, ZrSiO$_x$N$_y$, and/or Si$_3$N$_4$ (layer 3) | 30-400 Å | 80-250 Å | 180 Å |
| ZnO$_x$:B (layer 7) | 10-300 Å | 60-120 Å | 50 Å |
| Ag (layer 9) | 50-250 Å | 80-150 Å | 130 Å |
| NiCrO$_x$ (layer 11) | 10-80 Å | 20-70 Å | 30 Å |
| SnO$_2$, ZrSiO$_x$N$_y$, and/or Si$_3$N$_4$ (layer 13) | 40-400 Å | 100-200 Å | 160 Å |
| Overcoat (layer 15) | 50-750 Å | 150-350 Å | 210 Å |

The above example thicknesses for layer 7 of course also apply to embodiments where the zinc oxide based layer 7 is doped with Ga and/or Al in addition to B. In certain example embodiments of this invention, coated articles herein may have the following low-E (low emissivity), solar and/or optical characteristics set forth in Table 2 when measured monolithically.

TABLE 2

Low-E/Solar Characteristics (Monolithic)

| Characteristic | General | More Preferred | Most Preferred |
|---|---|---|---|
| R$_s$ (ohms/sq.): | <=6.0 | <=5.0 | <=4.0 |
| E$_n$: | <=0.10 | <=0.08 | <=0.06 |
| T$_{vis}$ (%): | >=50 | >=60 | >=70 |

Moreover, coated articles including coatings according to certain example embodiments of this invention have the following optical characteristics (e.g., when the coating(s) is provided on a clear soda lime silica glass substrate 1 from 1 to 10 mm thick, preferably about 4 mm thick). In Table 3, all parameters are measured monolithically.

TABLE 3

Example Optical Characteristics (Monolithic)

| Characteristic | General | More Preferred |
|---|---|---|
| T$_{vis}$ (or TY)(Ill. C., 2 deg.): | >=60% | >=70% |
| a*$_t$ (Ill. C., 2°): | −6 to +6 | −4 to +4 |
| b*$_t$ (Ill. C., 2°): | −10 to +10.0 | −8 to +8 |
| L*$_t$: | >=89 | >=90 |
| R$_f$Y (Ill. C., 2 deg.): | <=15% | <=12% |
| a*$_f$ (Ill. C., 2°): | −10 to +10 | −6 to +6 |
| b*$_f$ (Ill. C., 2°): | −14.0 to +10.0 | −10.0 to +5 |
| L*$_f$: | 22-30 | 24-27 |
| R$_g$Y (Ill. C., 2 deg.): | <=15% | <=12% |
| a*$_g$ (Ill. C., 2°): | −10 to +10 | −8 to +8 |
| b*$_g$ (Ill. C., 2°): | −14.0 to +10.0 | −10.0 to +8 |
| L*$_g$: | 25-38 | 28-37 |

Moreover, coated articles including coatings according to certain example embodiments of this invention have the following optical characteristics when the coated article is an IG unit in certain example embodiments (e.g., for purposes of reference, when the coating is provided on a clear soda lime silica glass substrate 1 from 1 to 10 mm thick, preferably about 4 mm thick). It is noted that U-value is measured in accordance with EN 673.

TABLE 4

Example Optical Characteristics (IG Unit)

| Characteristic | General | More Preferred |
|---|---|---|
| T$_{vis}$ (or TY)(Ill. C., 2 deg.): | >=60% | >=70% |
| a*$_t$ (Ill. C., 2°): | −10 to +10 | −8 to +8 |
| b*$_t$ (Ill. C., 2°): | −10 to +10 | −8 to +8 |
| R$_{outside}$Y (Ill. C., 2 deg.): | <=18% | <=16% |
| a*$_{out}$ (Ill. C., 2°): | −10 to +10 | −8 to +8 |
| b*$_{out}$ (Ill. C., 2°): | −10.0 to +10.0 | −9 to +9 |
| R$_{inside}$Y (Ill. C., 2 deg.): | <=18% | <=16% |
| a*$_{inside}$ (Ill. C., 2°): | −10 to +10 | −8 to +8 |
| b*$_{inside}$ (Ill. C., 2°): | −14 to +10 | −10 to +9 |
| U-value (IG)(W/(m$^2$K)): | <=1.25 | <=1.15 |

Figure 2:
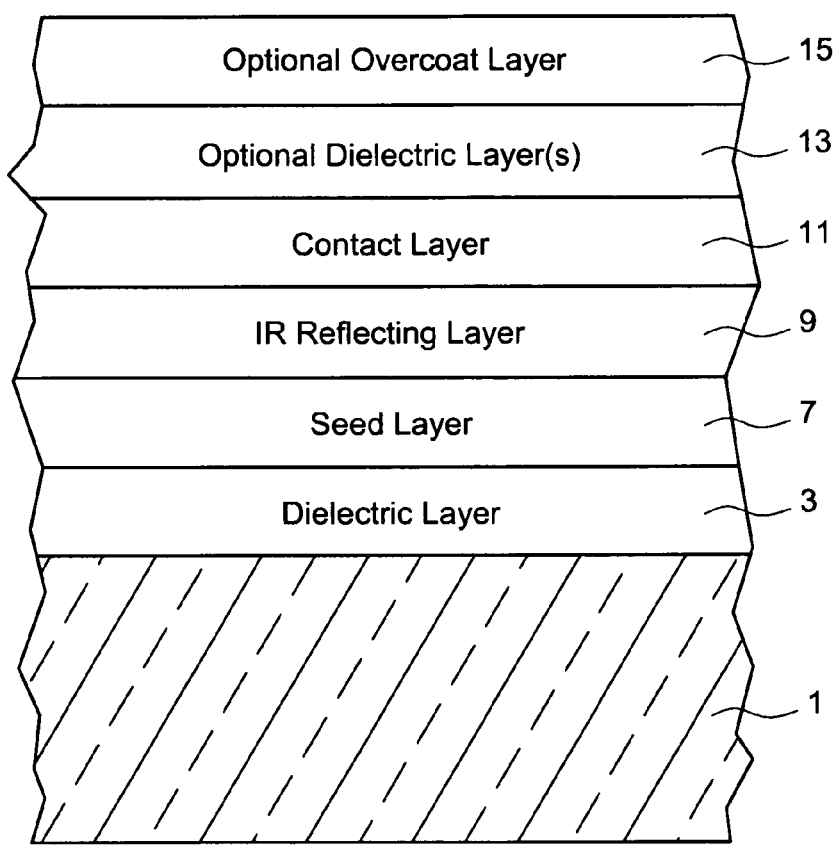
FIG. 2 is a cross-sectional view of a coated article according to a second example embodiment of this invention.

In the FIG. 2 embodiment, a seed layer 7 (the same as layer 7 discussed above in FIG. 1) comprising, or consisting essentially of, boron-doped zinc oxide is shown (optionally including Ga and/or Al as discussed above). In certain example embodiments, this layer has a greater hardness than zinc oxide not including boron. The FIG. 2 embodiment shows generally that dielectric layer(s) 3 of any suitable material may be provided under ZnO:B inclusive seed layer 7, and that IR reflecting layer 9 comprising silver and/or gold is over and contacting the ZnO:B based layer 7. Upper contact layer 11 is provided over the ZnO:B based layer 7. In certain example embodiments, layer 11 may comprise or consist essentially of nickel and/or chromium, or an oxide and/or nitride thereof. In other example embodiments, upper contact layer 11 may also comprise, or consist essentially of, a boron-doped zinc oxide-based layer, Ti metal, or an oxide of Ti. Optional dielectric layer(s) 13 and optional dielectric overcoat layer(s) 15 may be provided over the rest of the layers in the stack in certain example embodiments. While layers 13 and 15 may be of any suitable dielectric material, example materials for layers 13 and 15 are discussed above. For example, layer 13 may be of or include tin oxide or zinc oxide, and layer 15 may be of or include silicon nitride or zirconium oxide.

Figure 3:
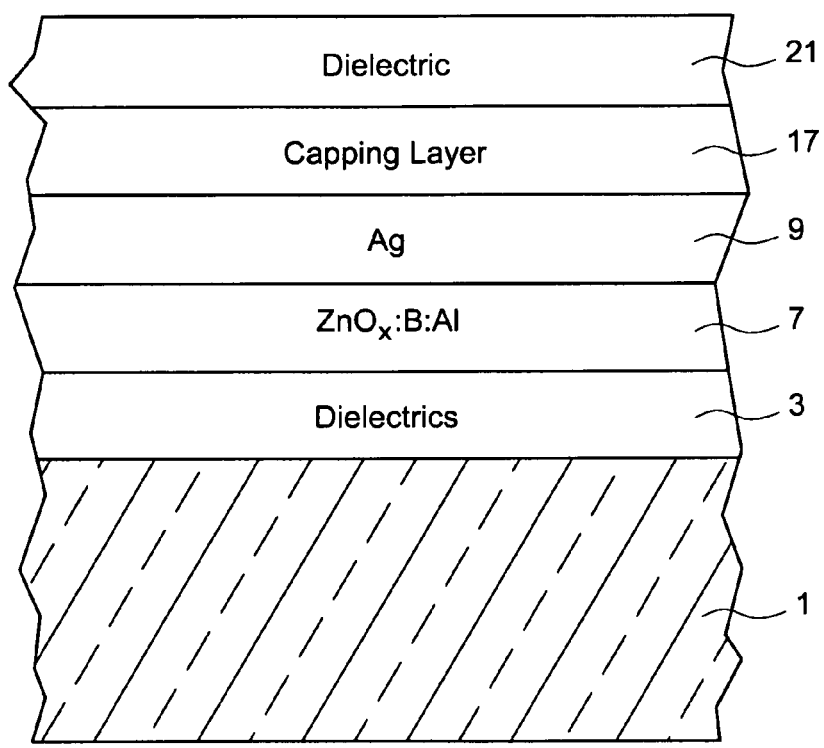
FIG. 3 is a cross-sectional view of a coated article according to a third example embodiment of this invention.

In FIG. 3, a boron and aluminum-doped zinc oxide based layer 7 is shown. In certain example embodiments, ZnO:Al:B will have better structural, electrical, and optical properties, with increased mechanical and/or chemical durability. The FIG. 3 embodiment shows generally that at least dielectric layer(s) 3 may be provided under ZnO:Al:B seed layer 7, and that IR reflecting layer of or including silver and/or gold is directly over and contacting the ZnO:Al:B based layer 7. Capping layer(s) 17 is provided over layer 9, though other layers not shown may be provided therebetween, such as contact layers and/or additional dielectric layers. Capping layer 17 may be of or include Ni and/or Cr in certain example embodiments, or may be of Ti or an oxide thereof in other example embodiments. Other layer(s) may of course be between the capping layer(s) 17 and the IR reflecting layer 9. Optional dielectric layer(s) 21 may be provided over the rest of the layers in the stack, and may be of or including silicon nitride, silicon oxynitride, zirconium oxide, or the like. As with the FIGS. 1-2 and 4-5 embodiments, this embodiment in FIG. 3 may optionally have a double silver stack so that two IR reflecting layers 9 (or 9 and 9') are present with another seed layer 7 (or 7') being located under each IR reflecting layer.

Figure 4:
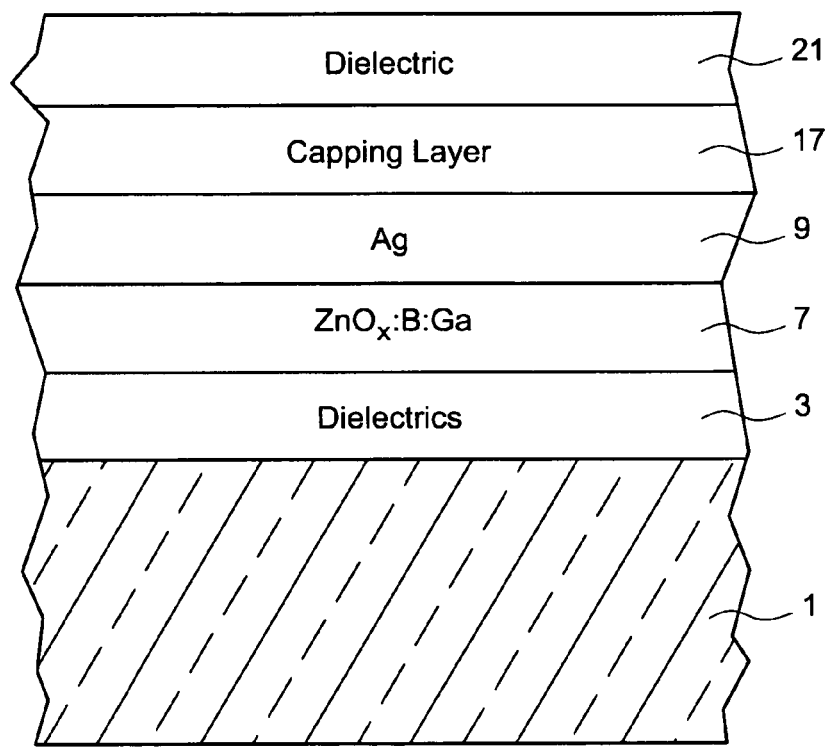
FIG. 4 is a cross-sectional view of a coated article according to a fourth example embodiment of this invention.

In FIG. 4, a boron and gallium-doped zinc oxide based seed layer 7 is shown. In certain example embodiments, ZnO:Ga:B will have a lower stress than a layer not including gallium as a dopant. The ZnO:Ga:B based layer 7 may also have better structural, electrical, and optical properties, with an overall increase in mechanical and/or chemical durability, in certain example embodiments. The FIG. 4 embodiment shows generally that dielectric layer(s) 3 may be provided under ZnO:Ga:B seed layer 7, and that IR reflecting layer 9 comprising silver and/or gold is over and contacting the ZnO:Ga:B based layer 7. Capping layer(s) 17 is provided over layer 9, though other layers may be provided therebetween. As discussed above, dielectric layer(s) 21 may also be provided.

Figure 5:
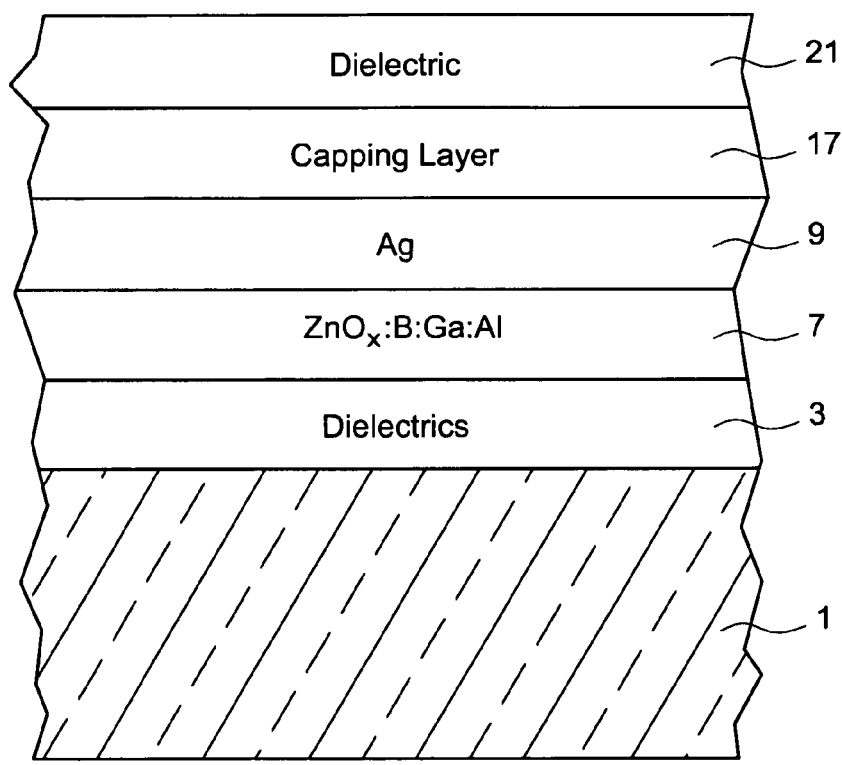
FIG. 5 is a cross-sectional view of a coated article according to a fifth example embodiment of this invention.

In FIG. 5, a boron, aluminum and gallium-doped zinc oxide based layer 7 is shown. In certain example embodiments, ZnO:Al:Ga:B will have a lower stress than a layer not including gallium as a dopant. The ZnO:Al:Ga:B based layer 7 may also have better structural, electrical, and optical properties, with an increased mechanical and/or chemical durability, in certain example embodiments. The FIG. 5 embodiment shows generally that dielectric layer(s) 3 may be provided under ZnO:Al:Ga:B seed layer 7, and that IR reflecting layer 9 comprising silver and/or gold is over and contacting the ZnO:Al:Ga:B based layer 7. Capping layer(s) 17 (e.g., of or including an oxide of Ni and/or Cr, or the like) is provided over layer 9, though other layers may be provided therebetween. Dielectric layer(s) 21 may optionally be provided as discussed above.

In FIG. 6, a coated article having a double silver stack, or multiple IR reflecting layers 9, 9' comprising silver is shown. The FIG. 6 embodiment shows that in certain example embodiments, more than one boron-doped zinc oxide based layer 7, 7' may used, particularly where there is more than one IR reflecting layer 9; however, the number boron-doped zinc oxide-inclusive layers is not dependent upon the number of IR reflecting layers (e.g., a boron doped zinc oxide based layer can be provided over a silver based layer as well). The boron-doped zinc oxide inclusive layer(s) 7 and 7' of the FIG. 6 embodiment may further comprise gallium and/or aluminum in other example embodiments. Dielectric layers 3, 4, 13 and 15 are also provided in the FIG. 6 embodiment, with example materials for these layers being shown in the figure. Optionally, in the FIG. 6 embodiment, a layer (not shown) of or including boron-doped ZnO, ZnO:Al, and/or ZnO:Ga (e.g., similar to layer 7 described herein) may be provided between layers 11 and 4, and/or between layers 11' and 13.

In FIG. 7, a coated article having more than one boron-doped zinc oxide based layer is shown, in connection with a coating have a single IR reflecting layer 9. This example is for purposes of showing that there may be more boron-doped zinc oxide based layer(s) (7, 11) than IR reflecting layer(s) 9 in a coating, in certain example embodiments, or that the boron-doped zinc oxide 11 may be provided over a silver based IR reflecting layer 9. For example and without limitation, a boron-doped zinc oxide based layer may be used as a seed layer 7 under the IR reflecting layer 9, as well as a(n) (upper) contact layer 11 located over the IR reflecting layer. Either of the boron-doped zinc oxide layers 7 and/or 11 of the FIG. 7 embodiment may further comprise gallium and/or aluminum in other example embodiments as discussed above in connection with other embodiments.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A coated article including a coating supported by a glass substrate, the coating comprising at least the following layers moving away from the glass substrate:
    a dielectric layer comprising zinc oxide doped with at least boron and gallium;
    an infrared (IR) reflecting layer comprising silver and/or gold located on the substrate over and directly contacting the layer comprising zinc oxide doped with boron and gallium,
    a dielectric layer on the substrate over at least the IR reflecting layer; and
    wherein the layer comprising zinc oxide doped with boron and gallium includes from about 0.01 to 8% boron (wt. %), where by weight the layer comprising zinc oxide doped with boron and gallium contains less boron than gallium.

2. The coated article of claim 1, wherein in the layer comprising zinc oxide doped with boron and gallium includes from about 0.02 to 5% boron (wt. %).

3. The coated article of claim 1, wherein the layer comprising zinc oxide doped with boron and gallium includes from about 0.5 to 3% boron (wt. %).

4. The coated article of claim 1, wherein the dielectric layer comprising zinc oxide doped with boron and gallium is substantially transparent.

5. The coated article of claim 1, wherein the dielectric layer comprising zinc oxide doped with boron and gallium further comprises aluminum.

6. A window unit comprising the coated article of claim 1.

7. The coated article of claim 1, wherein the coating is a low-emissivity (low-E) coating.

8. The coated article of claim 1, wherein the layer comprising zinc oxide doped with boron and gallium consists essentially of zinc oxide doped with boron gallium.

9. The coated article of claim 1, wherein the layer comprising zinc oxide doped with boron and gallium has a hardness of at least 9 GPa.

10. The coated article of claim 1, further comprising a contact layer located over and contacting the IR reflecting layer.

11. The coated article of claim 10, wherein the contact layer comprises zinc oxide doped with boron and at least one of gallium and aluminum.

12. The coated article of claim 10, wherein the contact layer comprises an oxide of Ni and/or Cr.

13. The coated article of claim 1, wherein the layer comprising zinc oxide doped with boron and gallium is from about 10-300 angstroms thick.

14. The coated article of claim 1, wherein the coating comprises at least first and second IR reflecting layers comprising silver, and each of the first and second IR reflecting layers comprising silver is located over and contacting a respective layer comprising zinc oxide doped with boron and gallium.

* * * * *